United States Patent [19]
Moore et al.

[11] Patent Number: 5,971,251
[45] Date of Patent: Oct. 26, 1999

[54] METHOD OF WELDING A TERMINAL TO A FLAT FLEXIBLE CABLE

[75] Inventors: Nathan Moore; Roger Wayt, both of Dearborn, Mich.

[73] Assignee: Lear Automotive Dearborn, Inc., Southfield Michigan, Mich.

[21] Appl. No.: 08/958,110

[22] Filed: Oct. 27, 1997

[51] Int. Cl.$^6$ .......................... H01L 21/60; B23K 20/12
[52] U.S. Cl. ..................................... 228/112.1; 228/180.5
[58] Field of Search .............................. 228/112.1, 180.5

[56] References Cited

U.S. PATENT DOCUMENTS 4,668,581   5/1987   Luc et al. ............................. 228/112.1

FOREIGN PATENT DOCUMENTS

| | | | |
|---|---|---|---|
| 286031 | 10/1988 | European Pat. Off. ............ | 228/180.5 |
| 53-64788 | 6/1978 | Japan ................................... | 228/180.5 |
| 61-53738 | 3/1986 | Japan ................................... | 228/180.5 |
| 2177336 | 1/1987 | United Kingdom ................ | 228/180.5 |

*Primary Examiner*—Patrick Ryan
*Assistant Examiner*—Jeffrey T. Knapp
*Attorney, Agent, or Firm*—Brooks & Kushman P.C.

[57] ABSTRACT

The invention relates to a method of welding terminal end connectors to wires in a flat flexible cable for use in vehicle wiring harnesses. The flat flexible cable includes a plurality of wires spaced apart from one another and surrounded by an insulating coating. A terminal with a tab is welded to each wire in the flat flexible cable. The welding method includes placing the tab portion of the terminal underneath one of the wires in the flat flexible cable. A tooling base supports the tab and the flat flexible cable. A tooling head engages the insulating coating along the top surface of the wire and moves in a path along the wire. The heat resulting from the friction between the tooling head and the insulating coating causes the insulating coating to flow away from the tooling head to expose the wire and frictionally weld the bottom surface of the wire to the top surface of the tab.

4 Claims, 1 Drawing Sheet

METHOD OF WELDING A TERMINAL TO A FLAT FLEXIBLE CABLE

BACKGROUND OF THE INVENTION

This invention generally relates to a unique method of welding a terminal to a wire in a flat flexible cable.

Flat flexible cables are used in wiring harnesses for vehicles. They are usually used in areas of the vehicle were packaging constraints require small, thin and flexible wiring harness assemblies to extend between electrical connectors. A typical flat flexible cable is comprised of a plurality of small gauge wires spaced apart from one another and surrounded by an insulating material. These flexible cables can be of various lengths depending on the application.

In order for the flat flexible cable to be electrically connected to a connector, conductive terminals have to be connected to each wire at an end of the cable. Because the wires in the flexible cable are very small gauge, the connecting methods used have to remove enough insulating material to provide sufficient surface area along the wire so that it can be securely connected to the terminal. A good connection between the wire and the terminal is required for good reliability, strength, and electrical properties.

Typical connection methods involve crimping or welding the terminal to the wire. Welding is preferred over crimping because the welding method provides greater surface area along the wire, thus, providing better reliability, strength and electrical properties. However, before the welding operation can be performed, the wires at the ends of the flat flexible cable must be stripped of their insulating coating. Currently, this stripping operation involves either an abrasion process or a laser process. Once the insulating coating has been stripped away, standard ultrasonic tooling can be used to weld the terminal to the exposed wire.

However, certain inefficiencies result from both the abrasive and laser processes for removing the insulating coating from the wires. Because the wires are thin, the abrasive process can damage or break the wires. Frequent wire damage or breakage can result in higher material costs and can increase assembly times due to removal and replacement of damaged cables. The laser stripping process is also undesirable because it is expensive.

Therefore, it is desirable to provide an inexpensive and efficient method of welding a terminal to a wire that does not damage or break the wire yet exposes sufficient surface area along the wire so that good reliability, strength, and electrical properties can be achieved when the terminals are connected to the wires in the cable.

SUMMARY OF THE INVENTION

In general terms this invention provides a method of welding terminals to wires in a flat flexible cable for use in vehicle wiring harnesses. The flat flexible cable includes a plurality of wires spaced apart from one another and surrounded by an insulating coating. A terminal with a tab is welded to each wire in the flat flexible cable. The inventive welding method includes placing the tab portion of the terminal underneath one of the wires in the flat flexible cable. A tooling base supports the tab and the flat flexible cable. A tooling head engages the insulating coating along the top surface of the wire and moves in a path along the wire. The heat resulting from the friction between the tooling head and the insulating coating causes the insulating coating to flow away from the tooling head exposing the wire and frictionally welding the bottom surface of the wire to the top surface of the tab.

Preferably, the method of the invention comprises the steps of providing a wire defining a longitudinal axis having a top and a bottom surface each covered by an insulating coating. A conductive terminal having a top and a bottom surface has a tab supported on a tooling base with the bottom surface of the coated wire placed over the tab. The top surface of the coated wire is engaged with a tooling head, and the tooling head is moved against the insulating coating sufficiently for heat to result from the frictional engagement between the tooling head and the insulating coating. The heat causes the insulating coating to flow away from the tooling head to expose the wire and to frictionally weld the wire to the top surface of the tab. The welding techniques, speed, etc. are generally known in the art as ultrasonic welding.

In preferred embodiments the tooling head has a plurality of ridges to facilitate the welding. Also, the tab may be provided with structure that provides space to receive the flowing insulation during the weld process.

The advantages of the invention include eliminating the abrasive or laser stripping processes for removing the insulating coating from the wires while providing an inexpensive and efficient way to remove the insulating coating during the welding process which does not break or damage the wires.

These and other features and advantages of this invention will become more apparent to those skilled in the art from the following detailed description of the presently preferred embodiment. The drawings that accompany the detailed description can be described as follows.

DESCRIPTION OF THE PREFERRED EMBODIMENT

Figure 1:
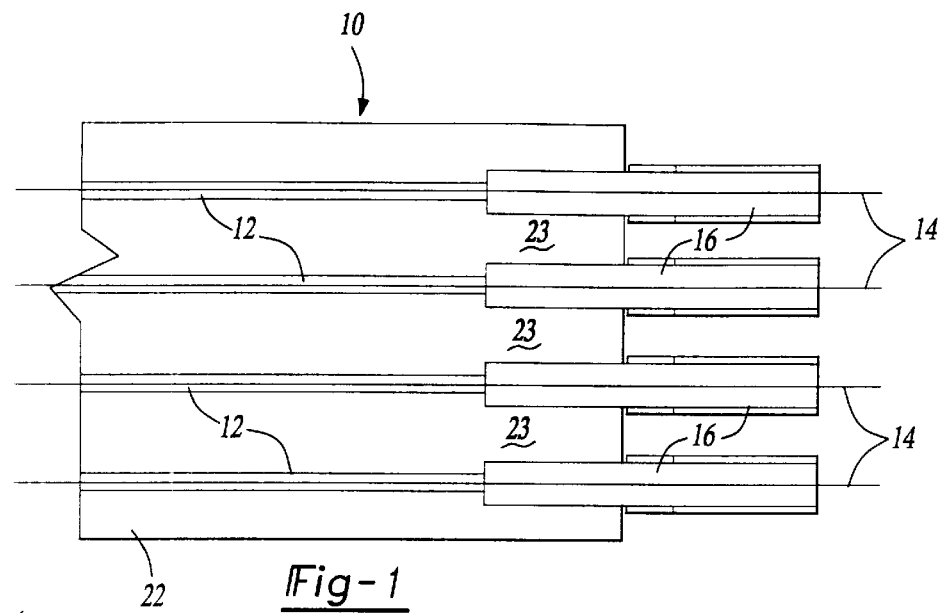
FIG. 1 is shows a flat flexible cable with terminals.

A flat flexible cable with welded terminals is shown generally at 10 in FIG. 1. The flat flexible cable is comprised of a plurality of wires 12 spaced apart from one another, each defining a longitudinal axis 14. A conductive terminal 16 is welded to each wire 12. The terminals 16 are used to electrically connect the flat flexible cable 10 to an electrical connector (not shown) in a vehicle wiring harness assembly.

Figure 2:
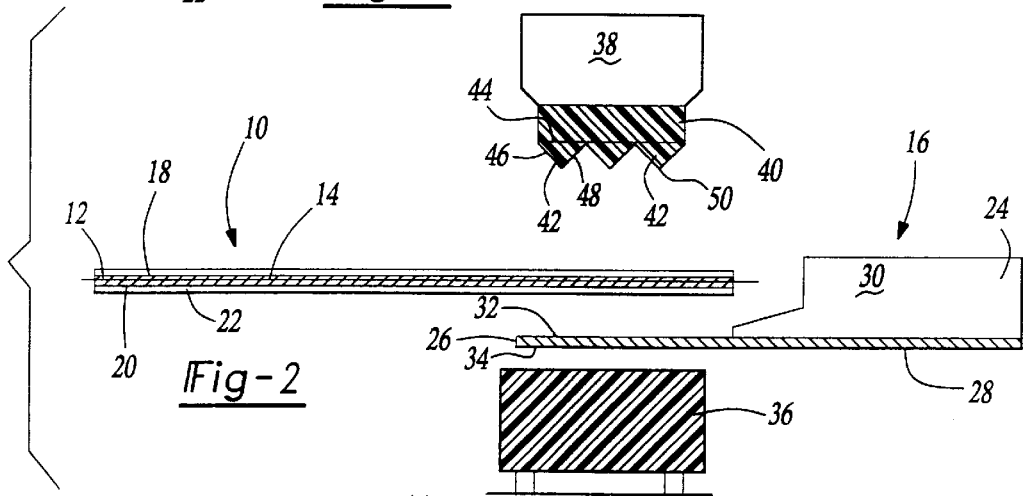
FIG. 2 is a cross sectional, exploded view of a flat flexible cable, a terminal and the tooling used in the inventive welding method.

Each wire 12 has a top surface 18 and a bottom surface 20, as shown in FIG. 2. An insulating coating 22 extends between and surrounds the wires 12. As shown, portions 23 of insulation remain between terminals 16.

As shown in FIG. 2, the conductive terminal 16 includes a connector 24 and a flat tab 26 extending outwardly from the connector 24. The tab 26 has a top surface 32 and a bottom surface 34. As a result of the welding process, discussed in detail below, the top surface 32 of the tab 26 is welded to the bottom surface 20 of the wire 12 such that the conductive terminal 16 extends outwardly from the wire 12 along its longitudinal axis 14.

During the welding process, a tooling base 36 supports the bottom surface 34 of the tab 26. The base and support structure may be as known in the art. The flat flexible cable 10 is placed on top of the tab 26 such that a wire 12 in the cable 10 is directly over the tab 26. A tooling head 38 engages the insulating coating 22 along the top surface 18 of the wire 12. The terminal 16 and the flat flexible cable 10 are held fixed with respect to the tooling head 38. The tooling head 38 is moved against the insulating coating 22 above the wire 12 such that the heat resulting from this frictional engagement between the tooling head 38 and the insulating coating 22 causes the insulating coating 22 to flow away from the tooling head 38, exposes the wire 12 and frictionally welds the wire 12 to the top surface 32 of the tab 26. This process is known as ultrasonic welding. As known, during this process there is a force applied between holding tooling head 38 against base 36. Thus, the welding process includes removing the insulating coating 22 from the wire 12 and welding the wire 12 to the terminal 16 simultaneously. This results in the elimination of a separate process for stripping or removing the insulating coating 22 before welding.

The tooling head 38 has a flattened tip 40 having a width, extending into the plane of FIG. 2, which is less than or equal to the diameter of the wire 12. The tooling head 38 engages the insulating coating 22 directly over the top surface 18 of the wire 12. The tooling head 38 is then moved along the length of the wire 12 in a path parallel to the longitudinal axis 14 of the wire 12 such that the insulating coating 22 is only removed directly over the top surface 18 of the wire 12.

In the preferred embodiment, the tooling head 38 has at least one triangular ridge 42 (three (3) ridges 42 are shown in FIG. 2) extending perpendicularly to the longitudinal axis 14 of the coated wire 12. The length of the ridge 42 is preferably less than or equal to the diameter of the wire 12. Each ridge 42 has a flat base 44 supported by the tooling head 38 with a first side 46 and a second side 48 extending downwardly at an angle from the flat base 44 to a pointed tip 50.

The lengths of the ridges 42 are perpendicular to the longitudinal axes 14 of the wires, such that each pointed tip 50 is spaced apart from one another and will contact the insulating coating 22 at a different location along the top surface 18 of the wire 12. Placing the lengths of the ridges 42 perpendicular to the wires 12 prevents the wires 12 from being damaged or broken during the welding process when the tooling head 38 is moved back and forth along the wire 12.

In the welding process the tooling head 38 is moved very quickly along a path parallel to the longitudinal axis 14. The tips 50 engage the insulating coating 22 directly over the wire 22 causing the insulating coating 22 to melt and flow away from the tooling head 38 along the top 18 and bottom 20 surfaces of the wire 12 due to the heat created by the frictional engagement between the tooling head 38 and the wire 12. When the wire 12 is exposed to the tab 26 the friction welds them securely together.

Figure 3:
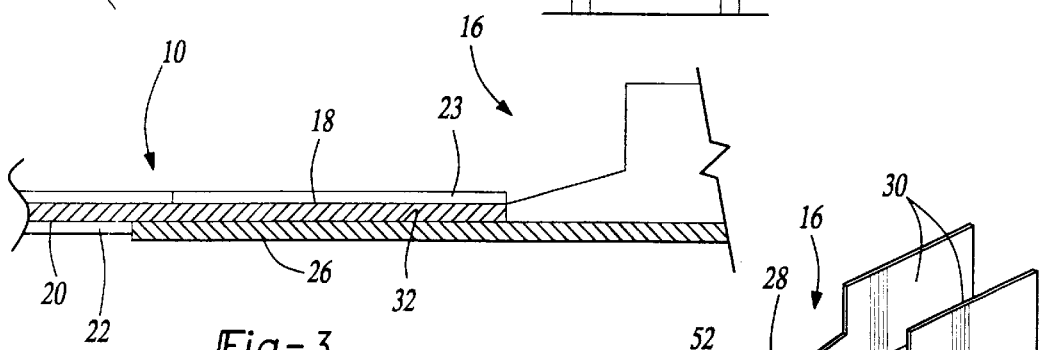
FIG. 3 is a cross sectional view of a terminal welded to a wire in a flat flexible cable.

When the welding process has been completed, the terminal 16 is securely welded to the flat flexible cable 10, as shown in FIG. 3. A portion of the top surface 18 of the wire 12 is exposed where the insulating coating 22 has been removed, while the bottom surface 20 of the wire 12 is welded to the top surface 32 of the tab 26. As can be seen the insulating portions 23 remain between wires 12. During the welding process, as the tooling head 38 is moved against the insulating coating 22 along the top surface 18 of the wire 12, the insulating coating 22 along the bottom surface 20 of the wire 12 flows away from the wire 12 due to the heat created from the frictional engagement between the tooling head 38 and the cable 10. This allows the tab 26 to securely bond to the wire 12 providing good reliability, strength, and electrical properties.

Figure 4:
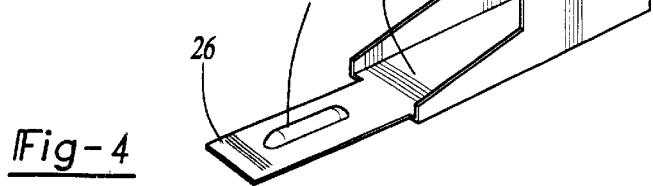
FIG. 4 shows a terminal with a conductive projection.

As shown in the FIG. 4 embodiment, the connector 24 portion of the terminal 16 is U-shaped with a flat bottom 28 and two upwardly extending sides 30. Sides 30 are rolled to form a terminal pin. The tab 26 extends outwardly from the bottom 28 of the connector 24 and is placed directly under the wire 12 in the flat flexible cable 10. While a U-shaped connector 24 is shown, the connector 24 can be of various shapes known in the art, such as a box, pin, etc..

Preferably, the top surface of the tab 26 includes at least one conductive projection 52 extending upwardly from the flat surface of the tab 26. The conductive projection 52 is placed directly underneath the bottom surface 32 of the wire 12. The addition of a conductive projection 52 provides a space for allowing the insulating material 22 to flow away from the bottom surface 20 of the wire when the tooling head 38 is frictionally engaging the flat flexible cable 10. This allows greater surface area along the bottom surface 20 of the wire 12 to be exposed which increases the strength of the weld. Although only one conductive projection 52 is shown in another embodiment, two conductive projections 52 are used on a tab 26.

In the preferred embodiment the flat flexible cable 10 is comprised of copper wires 12 surrounded by a polyester insulating coating 22. A copper terminal 16 is welded to each copper wire 12 in the cable 10 during the welding process. The tooling used for this welding process is standard ultrasonic tooling well known in the art. One tooling head 38 is used to weld each terminal 16 to each wire, thus either a single tooling head 38 is used to weld each terminal 16 to its respective wire 12, moving from one wire 12 to the next, or a plurality of tooling heads 38 are used to simultaneously weld all of the terminals 16 to all of the wires in the cable 10.

The preferred method of welding a terminal 16 to a wire 12 includes the following steps: providing a wire 12 defining a longitudinal axis 14 having a top surface 18 and a bottom surface 20 each covered by an insulating coating 22; providing a conductive terminal 16 having a tab 26 with a top surface 32 and a bottom surface 34; supporting the bottom surface 32 of the tab 26 on a tooling base 36 with the bottom surface 20 of the coated wire 12 thereover; engaging the top surface 18 of the coated wire 12 with a tooling head 38; and moving the tooling head 38 against the insulating coating 22 sufficiently for the heat resulting from the frictional engagement between the tooling head 38 and the insulating coating 22 to cause the insulating coating 22 to flow away from the tooling head 38, expose the wire 12 and frictionally weld the wire 12 to the top surface 32 of the tab 26.

The invention has been described in an illustrative manner, and it is to be understood that the terminology which has been used is intended to be in the nature of words of description rather than of limitation. Variations and modifications to the disclosed embodiment may become apparent to those skilled in the art and do come within the scope of this invention. Accordingly, the scope of legal protection afforded this invention can only be determined by studying the following claims.

We claim:

1. A method of welding a terminal to a coated wire comprising the steps of:
   1) providing a wire defining a longitudinal axis having a top surface and a bottom surface each covered by an insulating coating;
   2) providing a conductive terminal having a tab with a top surface and a bottom surface;

3) supporting the bottom surface of the tab on a tooling base with the bottom surface of the coated wire thereover;

4) providing a tooling head with a flat tip approximately equal to a diameter of the wire;

5) engaging the top surface of the coated wire with the tooling head moveable in a linear direction with respect to said base; and 6) moving the tooling head against the insulating coating directly over the top surface of the wire in a linear direction in a path parallel to the longitudinal axis of the coated wire and without rotating the tooling head sufficiently for the heat resulting from the frictional engagement between the tooling head and the insulating coating to cause the insulating coating to flow away from the tooling head, expose the wire and to frictionally weld the wire to the top surface of the tab.

2. A method of welding a terminal to a coated wire comprising the steps of:

1) providing a wire defining a longitudinal axis having a top surface and a bottom surface each covered by an insulating coating;

2) providing a conductive terminal having a tab with a top surface and a bottom surface;

3) providing the top surface of the tab with at least one conductive projection extending upwardly toward the coated wire;

4) placing the conductive projection directly underneath the bottom surface of the wire;

5) supporting the bottom surface of the tab on a tooling base with the bottom surface of the coated wire thereover;

6) engaging the top surface of the coated wire with a tooling head moveable in a linear direction with respect to said base;

7) fixing the tab and the coated wire with respect to the tooling head; and 8) moving the tooling head against the insulating coating directly over the top surface of the wire in a linear direction in a path parallel to the longitudinal axis of the coated wire and without rotating the tooling head sufficiently for the heat resulting from the frictional engagement between the tooling head and the insulating coating to cause the insulating coating to flow away from the tooling head, expose the wire and to frictionally weld the wire to the top surface of the tab.

3. A method of welding a terminal to a coated wire comprising the steps of:

1) providing a wire defining a longitudinal axis having a top surface and a bottom surface each covered by an insulating coating;

2) providing a conductive terminal having a tab with a top surface and a bottom surface;

3) supporting the bottom surface of the tab on a tooling base with the bottom surface of the coated wire thereover;

4) providing a tooling head with at least one ridge having a length perpendicular to the longitudinal axis of the coated wire, the length of the ridge being less than or equal to the diameter of the wire;

5) engaging the top surface of the coated wire with the tooling head moveable in a linear direction with respect to said base; and 6) moving the tooling head against the insulating coating directly over the wire in a linear direction in a path parallel to the longitudinal axis of the coated wire and without rotating the tooling head sufficiently for the heat resulting from the frictional engagement between the tooling head and the insulating coating to cause the insulating coating to flow away from the tooling head, expose the wire and to frictionally weld the wire to the top surface of the tab.

4. A method as recited in claim 3 including the steps of providing the tooling head with a plurality of ridges, each ridge having a flat base supported by the tooling head and having a first side and a second side extending from the flat base to a pointed tip, extending the length of the ridges perpendicular to the longitudinal axis of the coated wire, such that each pointed tip is spaced apart from one another and will contact the insulating coating at a different location along the wire.

* * * * *